United States Patent [19]

Theobald

[11] Patent Number: 5,040,197
[45] Date of Patent: Aug. 13, 1991

[54] FRACTIONAL FREQUENCY DIVIDER FOR PROVIDING A SYMMETRICAL OUTPUT SIGNAL

[75] Inventor: Kevin B. Theobald, Cambridge, Mass.
[73] Assignee: Codex Corp., Mansfield, Mass.
[21] Appl. No.: 490,861
[22] Filed: Mar. 9, 1990
[51] Int. Cl.[5] .................... H03K 21/02; H03K 21/12
[52] U.S. Cl. ........................................ 377/48; 377/49; 377/39
[58] Field of Search .................. 377/48, 49, 39, 47

[56] References Cited

U.S. PATENT DOCUMENTS

| 4,318,046 | 3/1982 | Sonntag | 377/48 |
| 4,694,475 | 9/1987 | Mehrgardt | 377/49 |
| 4,704,723 | 11/1987 | Markland | 377/48 |

*Primary Examiner*—John S. Heyman
*Attorney, Agent, or Firm*—Robert D. Atkins

[57] ABSTRACT

A frequency divider circuit is responsive to first and second digital input signals and an input clock signal for providing an output clock signal operating at a frequency equal to that of the input clock signal divided by the ratio of the first and second digital input signals. A register is initialized to a predetermined digital value for providing a first digital output signal. The first digital input signal is subtracted from the first digital output signal to form a second digital output signal for the first logic state of a digital control signal; otherwise the second digital output signal is set equal to a least significant portion of the first digital input signal for the second logic state of the digital control signal. The second digital output signal and the second digital input signal are added together for providing the next value of the first digital output signal which is stored back in the register to repeat the cycle. A most significant portion of the first digital output signal provides the digital control signal. The first logic state of the most significant bit of the first digital output signal also enables the output clock signal in sync with the input clock signal.

27 Claims, 3 Drawing Sheets

FRACTIONAL FREQUENCY DIVIDER FOR PROVIDING A SYMMETRICAL OUTPUT SIGNAL

BACKGROUND OF THE INVENTION

This invention relates in general to frequency dividing circuits, and more particularly, to a fractional frequency divider for providing an output clock signal operating at a frequency equal to that of the input clock signal divided by the ratio of two integer values.

The need to generate a lower frequency clock signal from a higher frequency timing base signal is common in many of the electronic arts. In the field of data communications, for example, common operating frequencies for transmitting data over a modem link are 1200, 2400 and 9600 baud which may be realized by dividing a 1.152 MHz input clock signal by 960, 480 and 120, respectively. The conventional technique for generating the lower frequency output clock signal typically involves decrementing a counter preset to an integer value N once for each period of the input clock signal, hereinafter referred to as linear frequency division. The output clock signal remains logic zero until the counter reaches zero at which time the linear frequency divider generates one pulse and reloads the counter with the integer N. Thus, the linear frequency divider produces one output period every N input periods, i.e., the input clock is divided by N. The 1.152 MHz input clock signal is typically developed via a dedicated crystal oscillator designed specifically for such data communication purposes. It would be desirable to eliminate the 1.152 MHz crystal oscillator thereby simplifying the system design and reducing the manufacturing costs. This could be accomplished by using another high frequency clock signal, say a 10 MHz microprocessor clock already available in the system; however, in order to develop the appropriate operating frequencies, i.e., 1200, 2400 and 9600 Hz, the 10 MHz clock signal must be divided by the non-integer values 8333.33, 4166.67 and 1041.67, respectively. In practice, the high frequency timing base clock signal is typically divided in multiple steps of smaller increments per step to achieve the aforementioned operational frequencies.

Consequently, fractional frequency dividers have been developed to divide the frequency of the input clock signal by a non-integer value such as the ratio N/D where N and D are integers and N is greater than D. One such fractional frequency divider is the well known phase lock loop which can produce a virtually jitter free output clock signal having a predetermined frequency and duty cycle. However, many applications in data communications require synchronization between the edges of the input clock signal and the lower frequency output clock signal; a feature not available with phase locked loops. Furthermore, the phase lock loop is relatively complex and expensive to implement requiring substantial logic circuitry and a reference clock signal operating at a much higher frequency than even the input clock signal being divided. Hence, the phase lock loop is not a viable solution for many data communication applications because of the synchronization problems and excessive complexity.

Another fractional frequency divider may be achieved with the linear frequency divider wherein, for the example of a 7/2 (N=7, D=2) divider ratio, the frequency divider must generate two output pulses for every seven pulses of the input clock signal. For such an implementation, the output clock signal may remain logic zero for five decrements of the counter followed by alternating logic one and logic zero at the rate of the input clock signal during the next two consecutive cycles of the input clock signal thereby producing one longer period (six cycles of the input clock signal) and one shorter period (one cycle of the input clock signal) over the seven cycles of the input clock signal. The repeating output clock signal comprising alternating long and short periods is noticeably non-symmetrical and can be even more so with other divider ratios N/D, such as N=13 and D=5. Since the output clock signal is often applied as the input clock signal to another frequency divider circuit further downstream for providing the multiple division steps to reach the desired low frequency operational clock signal, the non-symmetry of the output clock signal can be a major problem in form of undesirable jitter in the operational clock signal.

Hence, what is needed is a frequency divider circuit for providing an output clock signal operating at a fractional frequency of the input clock signal while maintaining a substantially symmetrical output waveform thereby reducing the jitter for lower frequency operational clock signals generated therefrom.

SUMMARY OF THE INVENTION

Accordingly, an objective of the present invention is to provide an improved fractional frequency divider.

Another objective of the present invention is to provide an improved fractional frequency divider for dividing the frequency of an input clock signal by the ratio of two integer values.

Yet another objective of the present invention is to provide an improved fractional frequency divider for providing substantially symmetrical output periods differing by no more than one cycle of the input clock signal.

Still another objective of the present invention is to provide an improved fractional frequency divider for providing substantially symmetrical output periods thereby reducing the jitter for lower frequency operational clock signals generated therefrom.

In accordance with the above and other objectives there is provided a frequency divider circuit responsive to first and second digital input signals and an input clock signal for providing an output clock signal operating at a frequency equal to that of the input clock signal divided by the ratio of the first and second digital input signals for producing an output clock signal. A controllable subtracter is responsive to the first logic state of the output clock signal for providing a first digital output signal as the difference between a second digital output signal applied at a first plurality of inputs and the first digital input signal applied at a second plurality of inputs. The controllable subtracter is responsive to the second logic state of the output clock signal for providing the first digital output signal equal to the second digital output signal. An adder circuit is coupled for summing the first digital output signal of the controllable subtracter and the second digital input signal for providing the second digital output signal at a plurality of outputs, and a register is provided having a plurality of inputs respectively coupled to the plurality of outputs of the adder circuit, wherein the least significant outputs of the plurality of outputs of the register are respectively coupled to the first plurality of inputs of the controllable substracter, wherein the most significant output of the plurality of outputs of the register is coupled to the controllable subtracter for providing the output clock signal.

In another form, the frequency divider circuit is responsive to first and second digital input signals and an input clock signal for providing an output clock signal operating at a frequency equal to that of the input clock signal divided by the ratio of the first and second digital input signals. A controllable adder is responsive to the first logic state of the output clock signal for providing a first digital output signal as the sum of a second digital output signal applied at a first plurality of inputs and the first digital input signal applied at a second plurality of inputs. The controllable adder is responsive to the second logic state of the output clock signal for providing the first digital output signal equal to the second digital output signal. A subtracter circuit is coupled for taking the difference between the first digital output signal of the controllable adder and the second digital input signal for providing the second digital output signal at a plurality of outputs, and a register is provided having a plurality of inputs respectively coupled to the plurality of outputs of the substracter circuit, wherein the least significant outputs of the plurality of outputs of the register are respectively coupled to the first plurality of inputs of the controllable adder, wherein the most significant output of the plurality of outputs of the register is coupled to the controllable adder for providing the output clock signal.

In yet another form, the frequency divider circuit is responsive to first and second digital input signals and an input clock signal for dividing the frequency of the input clock signal by the ratio of the first and second digital input signals. A first circuit is responsive to the first logic state of the output clock signal for providing a first digital output signal as the difference between the first digital input signal and a second digital output signal. The first circuit is responsive to the second logic state of the output clock signal for providing the first digital output signal equal to the second digital output signal. A second circuit sums the first digital output signal of the first circuit and the second digital input signal for providing the second digital output signal, and a third circuit provides the output clock signal from a comparison the second digital output signal of the second circuit and the first digital input signal. The output clock signal reflects the first logic state if the second digital output signal is greater than the first digital input signal, and the second logic state if the second digital output signal is less than or equal to the first digital input signal.

DETAILED DESCRIPTION OF THE PREFERRED EMBODIMENT

Figure 1:
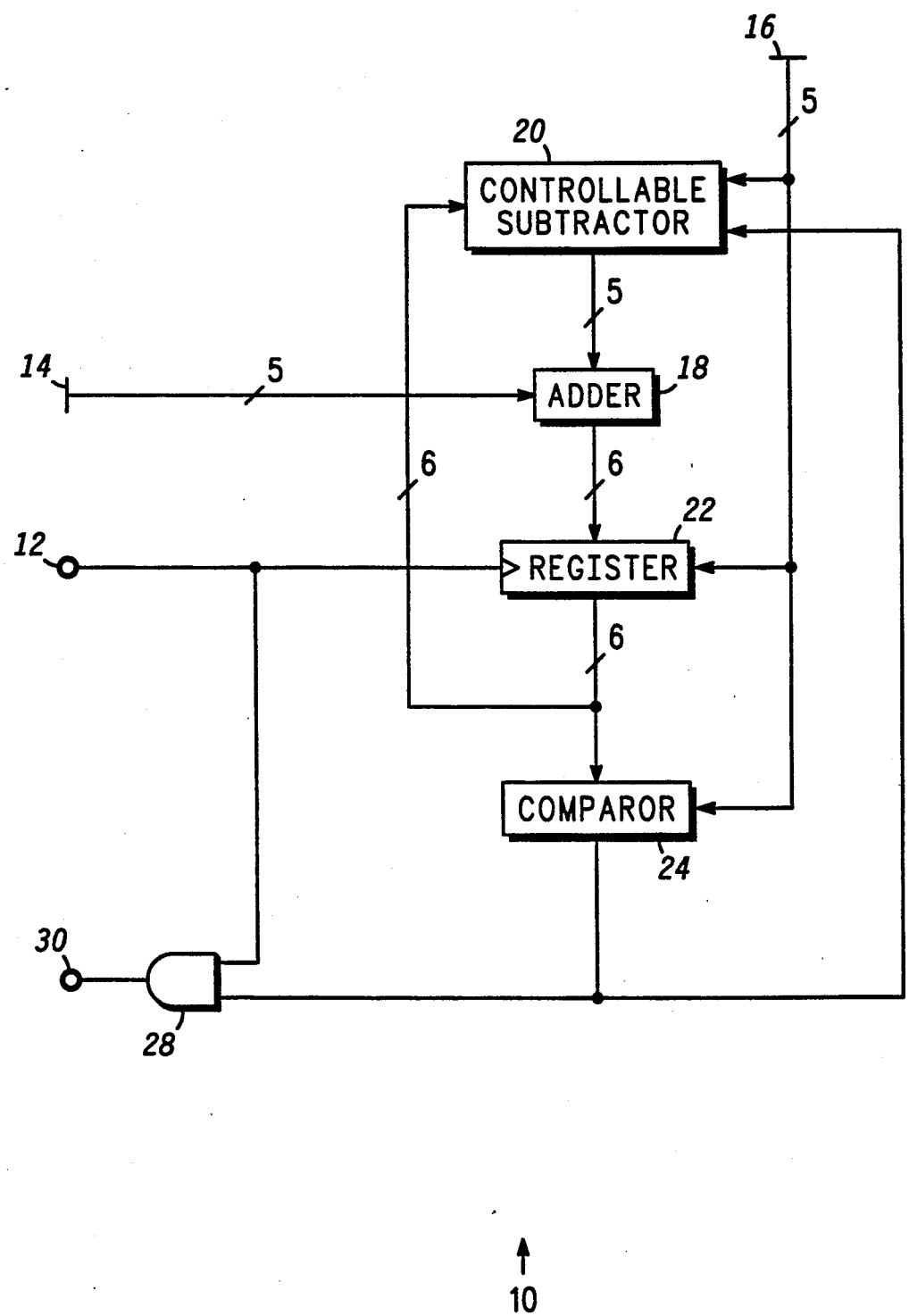
FIG. 1 is a simplified block diagram illustrating one embodiment of the present invention.

Referring to FIG. 1, fractional frequency divider 10 is shown suitable for manufacturing as an integrated circuit using conventional integrated circuit processing techniques. A high frequency input clock signal, $S_{12}$, oscillating at say 10 MHz and having a 50% duty cycle and a period of 100 nanoseconds (ns) is applied at input 12. First and second 5-bit digital signals representing integers D and N are applied at input bus 14 and input bus 16 which are coupled to the first input of adder 18 and the first input of controllable substracter 20, respectively. The output of controllable subtracter 20 is coupled to the second input of adder 18, and the output of adder 18 is coupled to the first input of register 22, while the second input of the latter is coupled to input bus 16. The output of register 22 is coupled to the first input of comparor 24 and to the second input of controllable subtracter 20. Register 22 is clocked by input clock signal $S_{12}$. Input bus 16 is coupled to the second input of comparor 24, and the output of comparor 24 is coupled to the first input of AND gate 28 and to the control input of controllable subtracter 20. The second input of AND gate 28 is coupled to input 12, while the output of AND gate 28 provides the lower frequency output clock signal, $S_{30}$, at output 30.

Consider the operation of fractional frequency divider 10 wherein the 10 MHz input clock signal $S_{12}$ is to be divided by the ratio of N/D where the integer N=7 and the integer D=2 thereby yielding output clock signal, $S_{30}$, operating at a frequency of 10 MHz/3.5, or approximately 2.857 MHz. It is understood that the values for integers N and D are selected for an illustration of the present invention and the integers N and D may take on many different values provided integer N is greater than integer D. The 5-bit digital signal "00010" representing the integer D=2 is applied at input bus 14 and the 5-bit digital signal "00111" is applied at input bus 16 for the integer N=7. Comparor 24 compares the 5-bit digital signal N with the 6-bit digital output signal of register 22 and outputs a logic one if the 6-bit digital output signal of register 22 is greater than the 5-bit digital signal N; otherwise comparor 24 produces a logic zero. If the digital output signal of comparor 24 is logic one, then the 5-bit digital signal N is subtracted from the 6-bit digital output signal of register 22 and the result is applied to the second input of adder 18; otherwise, if the digital output signal of comparor 24 is logic zero, the 6-bit digital output signal of register 22 is simply passed through controllable substracter 20 to the second input of adder 18.

Figure 2:
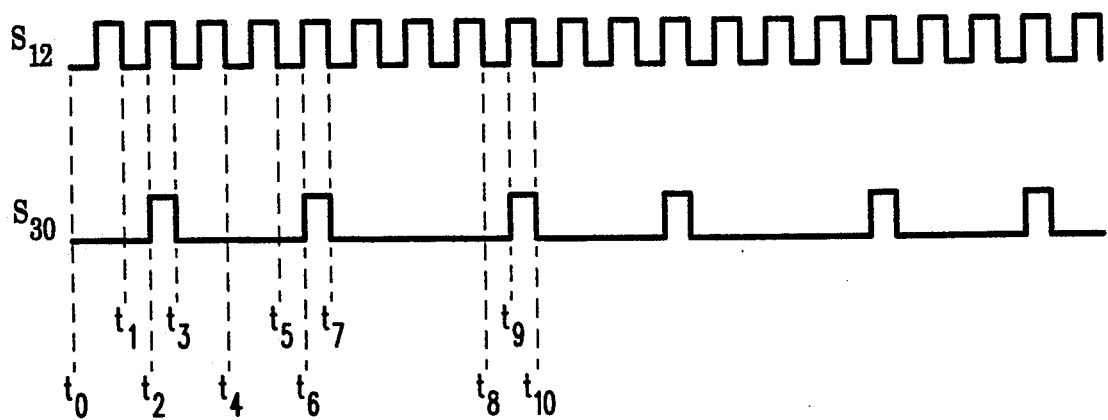
FIG. 2 is a waveform plot useful in the description of the invention.

To commence operation, the 5-bit digital signal N is first loaded into 6-bit-wide register 22 as "000111" via the second input thereof at time $t_0$ coinciding with a reset pulse (not shown). Register 22 may take on other initial values such as "000000" which simply shifts the starting point of the repeating output waveform. Since the control input signal of controllable substracter 20 is initially logic zero (digital output of register 22 is not greater than digital signal N), the digital output signal of register 22 "000111" is passed therethrough and added with the 5-bit digital signal D "00010" yielding "001001" at the output of adder 18. The 6-bit digital output signal of adder 18 is clocked into register 22 on the falling edge of input clock signal $S_{12}$ at time $t_1$ as shown in FIG. 2. The waveform plots of FIG. 2 illustrate the timing relationship between input clock signal $S_{12}$ and output clock signal $S_{30}$. Between times $t_1$ and $t_2$, the 6-bit digital output signal of register 22 "001001" is compared with the 5-bit signal N "00111" via comparor 24 and the result, now logic one, is applied at the first input of AND gate 28 and to the control input of controllable substracter 20 thereby subtracting the 5-bit signal N "00111" from the 6-bit digital output signal of register 22 "001001" and adding the 5-bit signal D "00010" yielding "001001" − "000111" + "00010" = "000100" at the output of adder 18. At time $t_2$, input clock signal $S_{12}$ transitions to logic one and combines with the logic one provided at the output of comparor 24 to produce a logic one at output 30 during times $t_2$ through $t_3$ of FIG. 2. At time $t_3$, input clock signal $S_{12}$ falls to logic zero causing output clock signal $S_{30}$ to follow. Also at the falling edge of the input clock signal $S_{12}$ (time $t_3$), the 6-bit digital output signal of adder 18 "000100" is clocked into register 22. The digital output signal of comparor 24 returns to logic zero since the 6-bit digital output signal of register 22 is less than the 5-bit signal N.

The cycles continue and register 22 clocks in values "000110" at time $t_4$ and "001000" at time $t_5$. Again the comparison of the 6-bit digital output signal of register 22 and the 5-bit signal N between times $t_5$ and $t_6$ finds the former greater than the latter and the digital output signal of comparor 24 becomes logic one. The logic one is combined with the logic one state of input clock signal $S_{12}$ at time $t_6$ for providing the logic one at output 30 during times $t_6$ through $t_7$ of FIG. 2. The logic one state of the digital output signal of comparor 24 also enables controllable subtracter 20 whereby the 5-bit digital signal N "00111" is subtracted from the 6-bit digital output signal of register 22 "001000" yielding "000001" at the output thereof. The 5-bit digital output signal of controllable subtracter 20 is added to the 5-bit digital signal D and the result "000011" is clocked into register 22 at time $t_7$. The output clock signal $S_{30}$ returns to logic zero with the transition of input clock signal $S_{12}$ to logic zero and the digital output signal of comparor 24 returns to logic zero since the 6-bit digital output signal of register 22 is again less than the 5-bit digital signal N.

On subsequent falling edges of input clock signal $S_{12}$, register 22 clocks in values "000101", "000111" and "001001". After the "001001" value is clocked into register 22 at time $t_8$, the digital output signal of comparor 24 again enables controllable subtracter 20 since the 6-bit digital output signal of register 22 "001001" is greater than the digital signal N "000111". The 6-bit digital output signal of adder 18 is then "001001" − "000111" + "00010" = "000100". At the rising edge of input clock signal $S_{12}$ at time $t_9$, output clock signal $S_{30}$ rises to logic one and returns to logic zero at the falling edge of input clock signal $S_{12}$, at which time the 6-bit digital output signal of adder 18 "0000100" is clocked into register 22 thereby completing two periods of output clock signal $S_{30}$ for seven cycles of input clock signal $S_{12}$ and returning register 22 to its value at time $t_3$. The periods of output clock signal $S_{30}$ then repeat with symmetrical rhythm at alternating time intervals; one lasting 300 ns (three cycles of input clock signal $S_{12}$) and one lasting 400 ns (four cycles of input clock signal $S_{12}$). Output clock signal $S_{30}$ cycles twice for every seven cycles of input clock signal $S_{12}$, that is, the frequency of output clock signal $S_{30}$ is 10 MHz divided by 7/2. The average of the 300 ns period and the 400 ns period is 350 ns which translates to approximately 2.857 MHz matching the initial calculation. The consecutive periods of output clock signal $S_{30}$ differ by no more than one period of the input clock signal.

A similar symmetry may be demonstrated for other divider ratios, for example, with the integer N=13 and the integer D=5, the periods of output clock signal $S_{30}$ operate at repeating time intervals wherein one interval (thirteen cycles of $S_{12}$) includes two consecutive 300 ns periods followed by one 200 ns period, one 300 ns period and another 200 ns period. In combination, the average period of output clock signal $S_{30}$ ((300+300+200+300+200)/5) is 260 ns, or approximately 3.846 MHz. This result matches the original calculation method of 10 MHz divided by 13/5, or 3.846 MHz. Of course, the ratio of N/D may also be an integer value such as 26/13 wherein the periods of output clock signal $S_{30}$ are each of the same length of time.

Figure 3:
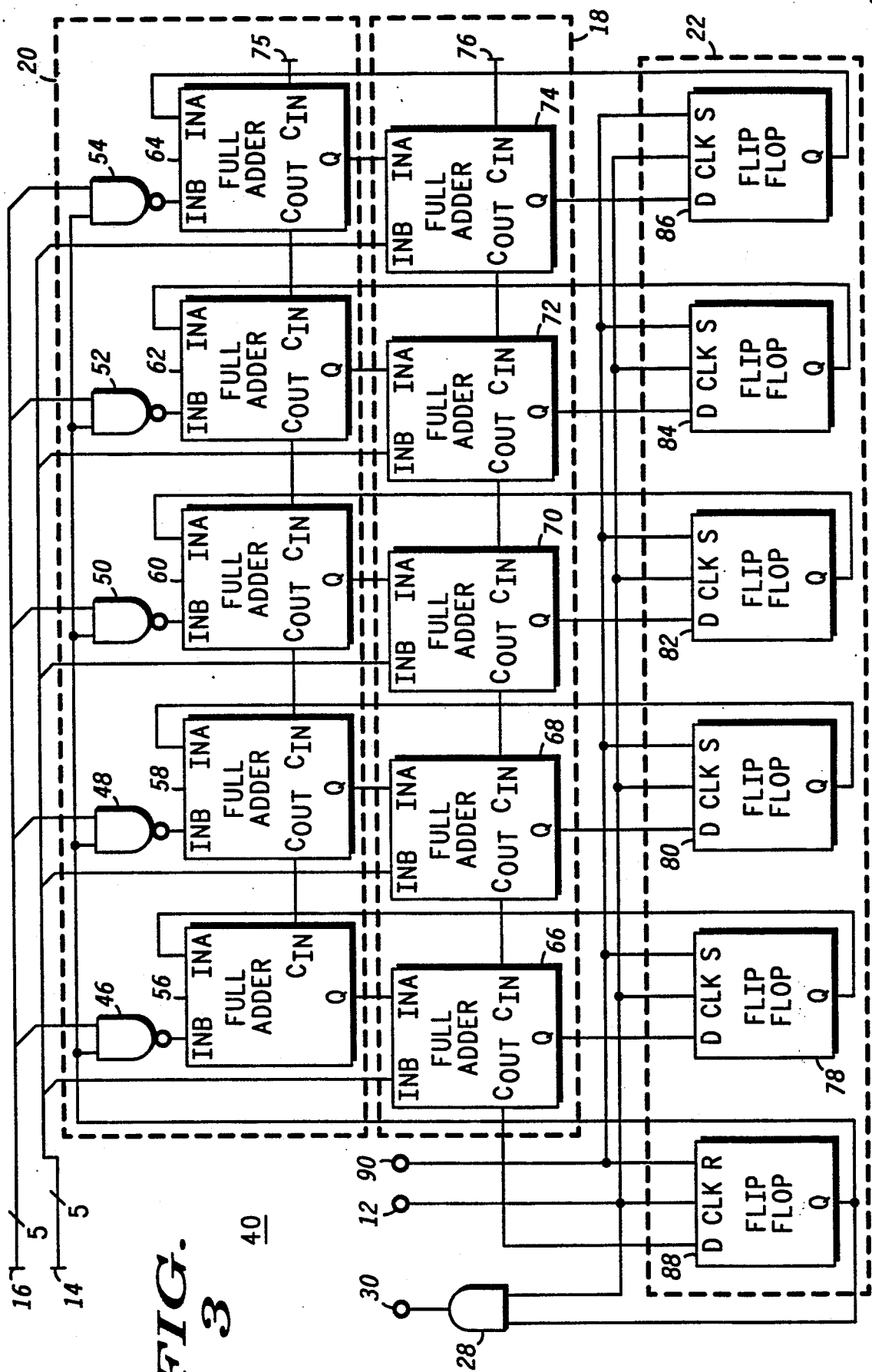
FIG. 3 is a simplified block diagram illustrating an alternate embodiment of the present invention.

Turning to FIG. 3, there is shown fractional frequency divider 40 as an alternate embodiment of the present invention which eliminates the need for comparor 24. Components having similar functions are given the same reference numbers as FIG. 1. The high frequency input clock signal $S_{12}$ is applied at input 12, and first and second 5-bit digital signals representing integers D and N, respectively, are applied at input buses 14 and 16. The five conductors of input bus 16 are coupled to the first inputs of NAND gates 46, 48, 50, 52 and 54, respectively, while the outputs of NAND gates 46–54 are coupled to the INB inputs of full adders 56, 58, 60, 62 and 64. NAND gates 46–54 and full adders 56–64 collectively provide controllable subtracter 20. The Q outputs of full adders 56–64 are coupled to the INA inputs of full adders 66, 68, 70, 72 and 74, respectively, which combine to form adder 18. The five conductors of input bus 14 are coupled to the INB inputs of full adders 66–74, respectively. The carry-in of full adder 64 is coupled for receiving a logic one signal applied at input 75, while the carry-out of the same is coupled to the carry-in of full adder 62. The carry-out of full adder 62 is coupled to the carry-in of full adder 60, and the carry-out of full adder 60 is coupled to the carry-in of full adder 58, while the carry-out of full adder 58 is coupled to the carry-in of full adder 56. Likewise, the carry-in of full adder 74 is coupled for receiving a logic zero signal applied at input 76, and the carry-out of adder 74 is coupled to the carry-in of full adder 72. The carry-out of full adder 72 is coupled to the carry-in of full adder 70, and the carry-out of full adder 70 is coupled to the carry-in of full adder 68, while the carry-out of full adder 68 is coupled to the carry-in of full adder 66. The Q outputs of full adders 66–74 are coupled to the D inputs of flipflops 78, 80, 82, 84 and 86, respectively, and the Q outputs of flipflops 78–86 are coupled to the INA inputs of full adders 56–64, respectively. The carry-out of full adder 66 is coupled to the D input of flipflop 88, and the Q output of the latter is coupled to the second inputs of NAND gates 46–54 and to the first input of AND gate 28. The combination of flipflops 78–88 form register 22.

Continuing with FIG. 3, input 12 is coupled to the second input of AND gate 28, the output of which provides the output clock signal $S_{30}$ at output 30 having a frequency equal to the frequency of the input clock $S_{12}$ divided by N/D. Input 12 is also coupled to the CLK (clock) inputs of flipflop 78–88, while input 90 is coupled to the R (reset) input of flipflop 88 and to the S (set) inputs of flipflops 78–86. Flipflops 78–88 are edge-triggered D-type flipflops, wherein the digital signal applied at the D input is latched to the Q output thereof at the falling edge of input clock signal $S_{12}$. The edge-triggering feature is used to avoid race conditions, i.e., when the output signal of flipflops 78–88 change state, the resulting output signal is propagated back to the inputs of the same flipflops via controllable subtracter 20 and adder 18. By using edge-triggered flipflops, it is assured that the new input signal will not propagate to the output until the following negative-going edge of input clock signal $S_{12}$.

The operation of fractional frequency divider 40 follows the discussion of FIG. 1 with certain distinctions as discussed below. The example using the 10 MHz input clock signal $S_{12}$ divided by the ratio of N/D where the integer N=7 and the integer D=2 is repeated here. Again, it is understood that the values for integers N and D are selected for an illustration of the present invention and the integers N and D may take on many different integer values provided integer N is greater than integer D. A reset pulse is applied at input 90 at time $t_0$ to load the value "011111" into register 22 which comprises flipflop 88 for the most significant bit (MSB) and flipflops 78-86 for the five least significant bits (LSB), respectively. Register 22 may take on other initial values such as "100000" which simply shifts the starting point of the repeating output waveform. The 5-bit digital signal "00010" representing the integer D=2 is applied at input bus 14, and the 5-bit digital signal "00111" is applied at input bus 16 for the integer N=7. The logic zero developed at the Q output of flipflop 88 is applied at the first input of AND gate 28 and to the second inputs of NAND gates 46-54 thereby producing digital signal "11111" at the outputs thereof. The combination of the digital signal "11111" applied at the INB inputs of full adders 56-64 with the logic one applied at the carry-in of full adder 64 effectively adds "00000" to the digital output signal of flipflops 78-86 "11111" applied at the INA inputs of full adders 56-64. The 5-bit digital output signal of full adders 56-64 "11111" is applied at the INA inputs of full adders 66-74, while the 5-bit digital signal D "00010" is applied at the INB inputs of the same. The 6-bit digital output signal of full adders 66-74 "11111"+"00010"="100001" is clocked through to the outputs of flipflops 78-88 on the falling edge of input clock signal $S_{12}$ at time $t_1$ as shown in FIG. 2. Notably, the MSB of the 6-bit digital output signal of full adders 66-74 is provided at the carry-out of full adder 66 and applied at the D input of flipflop 88. At time $t_2$, input clock signal $S_{12}$ transitions to logic one and combines with the logic one at the Q output of flipflop 88 for providing logic one at output 30 during times $t_2$ through $t_3$ of FIG. 2.

The logic one latched at the Q output of flipflop 88 also inverts the 5-bit digital signal N through NAND gates 46-54 providing "11000" at the INB inputs of full adders 56-64. Concurrently, the digital output signal of flipflops 78-86 "00001" is applied at the INA inputs of full adders 56-64, while logic one remains at the carry-in of fuller adder 64. The digital output signal provided at the Q outputs of full adders 56-64 is "00001"+"11000"+"1"="11010" thereby effective taking two's complement of the 5-bit signal N and adding the 6-bit digital output signal of register 22 which is the same as "100001"−"00111"="11010". The 5-bit digital output signal of full adders 56-64 "11010" is applied at the INA inputs of full adders 66-74, while the 5-bit digital signal D "00010" is applied at the INB inputs of the same, and the 6-bit digital output signal of full adders 66-74 "011100" is clocked through to the outputs of flipflops 78-88 on the falling edge of input clock signal $S_{12}$ at time $t_3$ as shown in FIG. 2. At time $t_3$, input clock signal $S_{12}$ falls to logic zero causing output clock signal $S_{30}$ to follow.

The cycles continue and register 22 clocks in values "011110" at time $t_4$ and "100000" at time $t_5$ at which time the logic one latched at the Q output of flipflop 88 again inverts the 5-bit digital signal N through NAND gates 46-54 providing "00000"+"11000"+"1"="11001" at the Q outputs of full adders 56-64, while the same logic one combines with the logic one state of input clock signal $S_{12}$ producing the logic one at output 30 during times $t_6$ through $t_7$ of FIG. 2. At time $t_7$, output clock signal $S_{30}$ returns to logic zero with the transition of input clock signal $S_{12}$ to logic zero and "011011" is clocked into register 22. On subsequent falling edges of input clock signal $S_{12}$, register 22 clocks in values "011101", "011111" and "100001" at time $t_8$. At the rising edge of input clock signal $S_{12}$ at time $t_9$, output clock signal $S_{30}$ rises to logic one. The next falling edge at time $t_{10}$ returns register 22 to its value at time $t_3$ thereby completing two periods of output clock signal $S_{30}$ for seven cycles of input clock signal $S_{12}$ wherein the first period occurred between times $t_3$ and $t_7$ and the second period occurred between times $t_7$ and $t_{10}$. Output clock signal $S_{30}$ cycles twice for every seven cycles of input clock signal $S_{12}$, that is, the frequency of output clock signal $S_{30}$ is 10 MHz divided by 7/2, or approximately 2.857 MHz.

It is also possible to reverse the order of subtraction and addition shown in FIG. 3 whereby element 20 becomes a controllable adder and element 18 is a full subtracter. In addition, NAND gates 46-54 are replaced with AND gates and a logic zero is applied at input 75, while the $\overline{Q}$ output of flipflop 88 is coupled to the second inputs of AND gates 46-54. For such a configuration, register 22 may be loaded with "100000" at time $t_0$. Following the previous discussion of FIG. 3 with regard to FIG. 2, the values latched into register 22 will be "011110" at time $t_1$, "100011" at time $t_3$, "100001" at time $t_4$, "011111" at time $t_5$, "100100" at time $t_7$, and "011110" at time $t_8$ again returning to the value at time $t_1$ thereby completing the two repeating periods of output clock signal $S_{30}$.

Hence, what has been described is a novel fractional frequency divider for dividing the frequency of an input clock signal by the ratio of two integer values while providing substantially symmetrical output periods differing by no more than one cycle of the input clock signal which reduces the jitter for lower frequency operational clock signals which may be generated downstream.

I claim:

1. A circuit responsive to first and second digital input signals and an input clock signal for dividing the frequency of the input clock signal by the ratio of the first and second digital input signals for producing an output clock signal, comprising:

first means responsive to a first logic state of the output clock signal for providing a first digital output signal that is the difference between the first digital input signal and a second digital output signal, said first means being responsive to a second logic state of the output clock signal for providing said first digital output signal equal to said second digital output signal;

second means for summing said first digital output signal and the second digital input signal for providing said second digital output signal; and third means for providing the output clock signal from a comparison of said second digital output signal and the first digital input signal, the output clock signal having the first logic state if said second digital output signal is greater than the first digital input signal, the output clock signal having the second logic state if said second digital output signal is less than or equal to the first digital input signal.

2. A circuit responsive to first and second digital input signals and an input clock signal for dividing the frequency of the input clock signal by the ratio of the first and second digital input signals, comprising:

first means responsive to a first logic state of a digital control signal for providing a first digital output signal that is the difference between the first digital input signal and a second digital output signal, said first means being responsive to a second logic state of said digital control signal for providing said first digital output signal equal to said second digital output signal;

second means for summing said first digital output signal and the second digital input signal for providing said second digital output signal;

third means for providing said digital control signal from a comparison of said second digital output signal and the first digital input signal, said digital control signal having the first logic state if said second digital output signal is greater than the first digital input signal, said digital control signal having the second logic state if said second digital output signal is less than or equal to the first digital input signal; and fourth means responsive to the first logic state of said control signal and the input clock signal for enabling an output clock signal operating at a frequency equal to the frequency of the input clock signal divided by the ratio of the first and second digital input signals.

3. The circuit of claim 2 wherein said first means includes a controllable subtracter having first and second inputs, a control input and an output, said first input being coupled for receiving the first digital input signal, said second input being coupled for receiving said second digital output signal, said control input being coupled for receiving said digital control signal provided by said third means.

4. The circuit of claim 3 wherein said controllable subtracter provides said first digital output signal as the difference between said second digital output signal and the first digital input for the first logic state of said digital control signal and otherwise propagates said second digital signal therethrough without the subtraction of the first digital signal for the second logic state of said digital control signal.

5. The circuit of claim 4 wherein said second means includes:

an adder having first and second inputs and an output, said first input being coupled for receiving the second digital input signal, said second input being coupled to said output of said controllable subtracter;

a register having first and second inputs and having an output and a clock input, said first input being coupled to said output of said adder, said second input being coupled for receiving the first digital input signal, said clock input being coupled for receiving the input clock signal.

6. The circuit of claim 5 wherein said third means includes a comparor circuit having first and second inputs and an output, said first input being coupled to said output of said register, said second input being coupled for receiving the first digital input signal.

7. The circuit of claim 6 wherein said fourth means includes a logic gate having first and second inputs and an output, said first input being coupled for receiving the input clock signal, said second input being coupled to said output of said comparor circuit, said output being coupled for providing said output clock signal operating at a frequency equal to the frequency of the input clock signal divided by the ratio of the first and second digital input signals.

8. A frequency divider circuit responsive to first and second digital input signals and an input clock signal for providing an output clock signal operating at a frequency equal to that of the input clock signal divided by the ratio of the first and second digital input signals, comprising:

a controllable subtracter responsive to a first logic state of the output clock signal for providing a first digital output signal that is the difference between a second digital output signal applied at a first plurality of inputs and the first digital input signal applied at a second plurality of inputs, said controllable subtracter being responsive to a second logic state of the output clock signal for providing said first digital output signal equal to said second digital output signal;

an adder circuit coupled for summing said first digital output signal and the second digital input signal for providing said second digital output signal at a plurality of outputs; and a register having a plurality of inputs respectively coupled to said plurality of outputs of said adder circuit and having a plurality of outputs for latching said second digital output signal, wherein the least significant outputs of said plurality of outputs of said register are respectively coupled to said first plurality of inputs of said controllable subtracter, wherein the most significant output of said plurality of outputs of said register is coupled to said controllable subtracter for providing the output clock signal.

9. The frequency divider circuit of claim 8 further comprising means for synchronizing the output clock signal and the input clock signal and providing a second output clock signal operating at a frequency equal to the frequency of the input clock signal divided by the ratio of the first and second digital input signals.

10. The frequency divider circuit of claim 9 wherein said controllable subtracter includes:

a plurality of logic gates each having first and second inputs and an output, said first inputs being coupled for receiving said digital control signal, said second inputs being respectively coupled for receiving the first digital input signal; and a first plurality of full adders each having first and second inputs and an output, said first inputs being coupled to the least significant outputs of said plurality of outputs of said register, said second inputs being respectively coupled to said outputs of said plurality of logic gates.

11. The frequency divider circuit of claim 10 wherein said first plurality of full adders includes:

a first full adder having first and second inputs, carry-in input, carry-out output and an output, said carry-in input being coupled to a terminal at which a logic signal is applied, said first input being coupled to the first least significant output of said plurality of outputs of said register, said second input being coupled to said output of a first one of said plurality of logic gates; and a second full adder having first and second inputs, carry-in input, carry-out output and an output, said carry-in input being coupled to said carry-out output of said first full adder, said first input being coupled to the second least significant output of said plurality of outputs of said register, said second input being coupled to said output of a second one of said plurality of logic gates.

12. The frequency divider circuit of claim 11 wherein said adder circuit includes a second plurality of full adders each having first and second inputs and and output, said first inputs being coupled to said outputs of said first plurality of full adders, said second inputs being respectively coupled for receiving the second digital input signal.

13. The frequency divider circuit of claim 12 wherein said second plurality of full adders includes:
a third full adder having first and second inputs, carry-in input, carry-out output and an output, said carry-in input being coupled to a terminal at which a logic signal is applied, said first input being coupled to said output of said first full adder, said second input being coupled for receiving the first least significant bit of the second digital input signal; and
a fourth full adder having first and second inputs, carry-in input, carry-out output and an output, said carry-in input being coupled to said carry-out output of said third full adder, said first input being coupled to said output of said second full adder, said second input being coupled for receiving the second least significant bit of the second digital input signal.

14. The frequency divider circuit of claim 13 wherein said register includes a plurality of flipflops each having an input and an output, said inputs being respectively coupled to said outputs of said second plurality of full adders, said outputs being respectively coupled to said second plurality of inputs of said controllable subtracter.

15. The frequency divider circuit of claim 14 wherein said plurality of flipflops includes:
a first flipflop having an input, an output and a clock input, said input being coupled to said output of said third full adder, said output being coupled to said first input of said first adder, said clock input being coupled for receiving the input clock signal;
a second flipflop having an input, an output and a clock input, said input being coupled to said output of said fourth full adder, said output being coupled to said first input of said second adder, said clock input being coupled for receiving the input clock signal; and
a third flipflop having an input, an output and a clock input, said input being coupled to the most significant carry-out output of said second plurality of full adders, said output being coupled for providing said digital control signal, said clock input being coupled for receiving the input clock signal.

16. A frequency divider circuit responsive to first and second digital input signals and an input clock signal for providing an output clock signal operating at a frequency equal to that of the input clock signal divided by the ratio of the first and second digital input signals, comprising:

a controllable adder responsive to a first logic state of the output clock signal for providing a first digital output signal that is the sum of a second digital output signal applied at a first plurality of inputs and the first digital input signal applied at a second plurality of inputs, said controllable adder being responsive to a second logic state of the output clock signal for providing said first digital output signal equal to said second digital output signal;
a subtracter circuit coupled for taking the difference between said first digital output signal and the second digital input signal for providing said second digital output signal at a plurality of outputs; and
a register having a plurality of inputs respectively coupled to said plurality of outputs of said subtracter circuit and having a plurality of outputs for latching said second digital output signal, wherein the least significant outputs of said plurality of outputs of said register are respectively coupled to said first plurality of inputs of said controllable adder, wherein the most significant output of said plurality of outputs of said register is coupled to said controllable adder for providing the output clock signal.

17. The frequency divider circuit of claim 16 further comprising means for synchronizing the output clock signal and the input clock signal and providing a second output clock signal operating at a frequency equal to the frequency of the input clock signal divided by the ratio of the first and second digital input signals.

18. The frequency divider circuit of claim 17 wherein said controllable adder includes:
a plurality of logic gates each having first and second inputs and an output, said first inputs being coupled for receiving said digital control signal, said second inputs being respectively coupled for receiving the first digital input signal; and
a first plurality of full adders each having first and second inputs and an output, said first inputs being coupled to the least significant outputs of said plurality of outputs of said register, said second inputs being respectively coupled to said outputs of said plurality of logic gates.

19. The frequency divider circuit of claim 18 wherein said first plurality of full adders includes:
a first full adder having first and second inputs, carry-in input, carry-out output and an output, said carry-in input being coupled to a terminal at which a logic signal is applied, said first input being coupled to the first least significant output of said plurality of outputs of said register, said second input being coupled to said output of a first one of said plurality of logic gates; and
a second full adder having first and second inputs, carry-in input, carry-out output and an output, said carry-in input being coupled to said carry-out output of said first full adder, said first input being coupled to the second least significant output of said plurality of outputs of said register, said second input being coupled to said output of a second one of said plurality of logic gates.

20. The frequency divider circuit of claim 19 wherein said subtracter circuit includes a second plurality of full adders each having first and second inputs and an output, said first inputs being coupled to said outputs of said first plurality of full adders, said second inputs being respectively coupled for receiving the second digital input signal.

21. The frequency divider circuit of claim 20 wherein said second plurality of full adders includes:

a third full adder having first and second inputs, carry-in input, carry-out output and an output, said carry-in input being coupled to a terminal at which a logic signal is applied, said first input being coupled to said output of said first full adder, said second input being coupled for receiving the first least significant bit of the second digital input signal; and a fourth full adder having first and second inputs, carry-in input, carry-out output and an output, said carry-in input being coupled to said carry-out output of said third full adder, said first input being coupled to said output of said second full adder, said second input being coupled for receiving the second least significant bit of the second digital input signal.

22. The frequency divider circuit of claim 21 wherein said register includes a plurality of flipflops each having an input and an output, said inputs being respectively coupled to said outputs of said second plurality of full adders, said outputs being respectively coupled to said second plurality of inputs of said controllable subtracter.

23. The frequency divider circuit of claim 22 wherein said plurality of flipflops includes:

a first flipflop having an input, an output and a clock input, said input being coupled to said output of said third full adder, said output being coupled to said first input of said first adder, said clock input being coupled for receiving the input clock signal;

a second flipflop having an input, an output and a clock input, said input being coupled to said output of said fourth full adder, said output being coupled to said first input of said second adder, said clock input being coupled for receiving the input clock signal; and a third flipflop having an input, an output and a clock input, said input being coupled to the most significant carry-out output of said second plurality of full adders, said output being coupled for providing said digital control signal, said clock input being coupled for receiving the input clock signal.

24. The frequency divider circuit of claim 23 wherein said means for synchronizing the output clock signal and the input clock signal includes a logic gate having first and second inputs and an output, said first input being coupled for receiving the input clock signal, said second input being coupled to said output of said third flipflop, said output being coupled for providing said second output clock signal.

25. A method of generating an output clock signal operating at a frequency equal to that of an input clock signal divided by the ratio of first and second digital input signals, comprising the steps of:

initializing a register for providing a first digital output signal having a predetermined value;

subtracting the first digital input signal from said first digital output signal to form a second digital output signal at the occurrence of a first logic state of the output clock signal and otherwise setting said second digital output signal equal to a least significant portion of said first digital input signal at the occurrence of a second logic state of the output clock signal;

adding said second digital output signal and the second digital input signal for providing the next value of said first digital output signal; and storing the next value of said first digital output signal in said register to repeat the cycle, wherein a most significant portion of said first digital output signal provides the output clock signal having said first or second logic states.

26. The method of claim 25 further comprising the step of synchronizing the input clock signal and the output clock signal and providing a second output clock signal.

27. A method of generating an output clock signal operating at a frequency equal to that of an input clock signal divided by the ratio of first and second digital input signals, comprising the steps of:

initializing a register for providing a first digital output signal having a predetermined value;

subtracting the first digital input signal from said first digital output signal to form a second digital output signal at the occurrence of a first logic state of the output clock signal and otherwise setting said second digital output signal equal to a least significant portion of said first digital input signal at the occurrence of a second logic state of the output clock signal;

adding said second digital output signal and the second digital input signal for providing the next value of said first digital output signal;

storing the next value of said first digital output signal in said register; and comparing said first digital output signal and the first digital input signal for providing the output clock signal, the output clock signal having the first logic state if said first digital output signal is greater than the first digital input signal, the output clock signal having the second logic state if said first digital output signal is less than or equal to the first digital input signal.

* * * * *